US008841948B1

(12) United States Patent
Chien et al.

(10) Patent No.: US 8,841,948 B1
(45) Date of Patent: Sep. 23, 2014

(54) INJECTION-CONTROLLED-LOCKED PHASE-LOCKED LOOP

(71) Applicant: Xilinx, Inc., San Jose, CA (US)

(72) Inventors: Jun-Chau Chien, Albany, CA (US);
Wayne Fang, Pleasanton, CA (US);
Parag Upadhyaya, Los Gatos, CA (US);
Jafar Savoj, Sunnyvale, CA (US);
Kun-Yung Chang, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/830,729

(22) Filed: Mar. 14, 2013

(51) Int. Cl.
*H03L 7/06* (2006.01)
*H03L 7/07* (2006.01)

(52) U.S. Cl.
CPC .................................. *H03L 7/07* (2013.01)
USPC ......................................... 327/158; 327/149

(58) Field of Classification Search
CPC ..... H03L 7/0814; H03L 7/0812; G11C 7/222
USPC .................................................. 327/149, 158
See application file for complete search history.

(56) References Cited

U.S. PATENT DOCUMENTS

| 6,704,383 B2 | 3/2004 | Lee et al. |
| 7,184,503 B2 | 2/2007 | Wong et al. |
| 7,368,961 B2 * | 5/2008 | Werner et al. ................. 327/156 |
| 7,719,331 B2 | 5/2010 | Kobayashi |
| 7,764,095 B2 * | 7/2010 | Werner et al. ................. 327/158 |
| 8,421,507 B2 | 4/2013 | Hsieh et al. |
| 8,487,675 B2 | 7/2013 | Hsieh et al. |
| 2006/0119405 A1 | 6/2006 | Kobayashi |
| 2007/0146038 A1 * | 6/2007 | Werner et al. ................. 327/291 |
| 2008/0150645 A1 * | 6/2008 | McCorquodale et al. 331/117 R |
| 2008/0303568 A1 * | 12/2008 | Werner et al. ................. 327/158 |
| 2009/0167451 A1 * | 7/2009 | McCorquodale et al. .... 331/176 |
| 2010/0019856 A1 * | 1/2010 | McCorquodale et al. .... 331/179 |
| 2010/0171776 A1 | 7/2010 | Yamagata et al. |
| 2011/0127990 A1 * | 6/2011 | Wilson et al. ............... 324/76.44 |
| 2011/0169585 A1 * | 7/2011 | McCorquodale et al. .... 331/179 |
| 2012/0119801 A1 | 5/2012 | Hsieh et al. |
| 2014/0035650 A1 * | 2/2014 | Zerbe et al. ................... 327/299 |

OTHER PUBLICATIONS

U.S. Appl. No. 13/830,590, filed Mar. 14, 2013, Fang.
Deng, Wei et al., "A 0.022 mm$^2$ 970 μW Dual-Loop Injection-Locked PLL with -243dB FOM Using Synthesizable All-Digital PVT Calibration Circuits," *Proc. of the 2013 IEEE International Solid-State Circuits Conference*, Feb. 17, 2013, pp. 248-249, IEEE, Piscataway, New Jersey, USA.
Elshazly, Amr et al., "A 1.5GHz 890 μW Digital MDLL with 400fs$_{rms}$ Integrated Jitter, -55.6dBc Reference Spur and 20fs/mV Supply-Noise Sensitivity using 1b TDS," *Proc. of the 2012 IEEE International Solid-State Circuits Conference*, Feb. 19, 2012, pp. 242-243, IEEE, Piscataway, New Jersey, USA.

(Continued)

*Primary Examiner* — Adam Houston
(74) *Attorney, Agent, or Firm* — W. Eric Webostad

(57) ABSTRACT

An apparatus relates generally to an injection-controlled-locked phase-locked loop ("ICL-PLL") is disclosed. In this apparatus, a delay-locked loop is coupled to an injection-locked phase-locked loop. An injection-locked oscillator of the injection-locked phase-locked loop is in a feedback loop path of the delay-locked loop.

20 Claims, 12 Drawing Sheets

(56) References Cited

OTHER PUBLICATIONS

Huang, Yi-Chieh et al., "A 2.4GHz Sub-Harmonically Injection-Locked PLL With Self-Calibrated Injection Timing," *Proc. of the 2012 IEEE International Solid-State Circuits Conference*, Feb. 19, 2012, pp. 338-339, IEEE, Piscataway, New Jersey, USA.

Lee, Jri et al., "Study of Subharmonically Injection-Locked PLLs," *IEEE Journal of Solid-State Circuits*, May. 2009, vol. 44, No. 5, pp. 1539-1553, IEEE, Piscataway, New Jersey, USA.

Lee, I-Ting et al., "A Divider-Less Sub-Harmonically Injection-Locked PLL with Self-Adjusted Injection Timing," *Proc. of the 2013 IEEE International Solid-State Circuits Conference*, Feb. 17, 2013, pp. 248-249, IEEE, Piscataway, New Jersey, USA.

U.S. Appl. No. 13/630,192, filed Sep. 28, 2012, Fang et al.

* cited by examiner

US 8,841,948 B1

INJECTION-CONTROLLED-LOCKED PHASE-LOCKED LOOP

TECHNICAL FIELD

The following description relates to integrated circuit devices ("ICs"). More particularly, the following description relates to an injection-controlled-locked phase-locked loop ("ICL-PLL") for an IC.

BACKGROUND

Conventionally, an injection-locked phase-locked loop ("IL-PLL") has two steady-state reference phases. If there is a mismatch in such reference phases, then there may be a static-phase-offset ("SPO"). Such an SPO may result in large deterministic jitter. Furthermore, depending on what process-voltage-temperature ("PVT") "corner" and/or variation may be "hit" by an injected pulse in an IL-PLL, one or more references spurs may be generated. These one or more reference spurs may cause jitter on an output clock from such IL-PLL. Along those lines, conventionally IL-PLLs have not been used in high-speed, low noise clock generation applications due to one or more such types of jitter.

Accordingly, it would be useful to provide an IL-PLL that overcomes one or more of the above-described limitations.

SUMMARY

An apparatus relates generally to an injection-controlled-locked phase-locked loop ("ICL-PLL"). In such an apparatus, a delay-locked loop is coupled to an injection-locked phase-locked loop. An injection-locked oscillator of the injection-locked phase-locked loop is in a feedback loop path of the delay-locked loop.

Another apparatus relates generally to another ICL-PLL. In such an apparatus, a pulse generator receives a reference frequency signal to generate a pulse signal. An adjustable delay receives the pulse signal to provide a first delayed pulse signal. An injection-locked oscillator is coupled to receive the first delayed pulse signal and to receive a first control signal to provide an oscillator output signal responsive thereto. The first control signal is of a first locked loop. The first locked loop includes the injection-locked oscillator. A second locked loop is coupled to receive a reference signal and the oscillator output signal to provide a second control signal. The reference signal is either the reference frequency signal or a version of the pulse signal. The second locked loop includes the adjustable delay. The injection-locked oscillator is in a feedback path of the second locked loop. The second control signal is coupled to control delay of the adjustable delay to control position of a pulse of the first delayed pulse signal for injection into the injection-locked oscillator.

A method relates generally to operation of an ICL-PLL. A reference frequency signal is obtained by an injection-locked phase-locked loop. A pulse signal is generated with a pulse generator of the injection-locked phase-locked loop coupled to receive the reference frequency signal. A reference signal is provided to a delay-locked loop coupled to the injection-locked phase-locked loop, where the reference signal is either the pulse signal or the reference frequency signal. A delay of the delay-locked loop is self-adjusted to control pulse injection in the injection-locked phase-locked loop responsive to a detected phase difference between an injection-locked oscillator output of the injection-locked phase-locked loop and a version of the reference signal. The injection-locked oscillator output is output from the injection-locked phase-locked loop.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 2-1 is a circuit diagram depicting an exemplary conventional injection-locked oscillator.

FIG. 2-2 is a block/circuit diagram depicting a small-signal discrete-time model of the injection-locked oscillator of FIG. 2-1.

FIG. 2-3 is a block/circuit diagram depicting a reconstruction of the small-signal discrete-time model of FIG. 2-2.

FIG. 2-4 is a block/circuit diagram depicting an exemplary conventional multiplying delay-locked loop ("MDLL").

FIG. 3-1 is a block/circuit diagram depicting an exemplary conventional injection-locked phase-locked loop ("IL-PLL") having a PLL.

FIG. 3-2 is a block/circuit diagram depicting an exemplary small-signal model for the IL-PLL 300 of FIG. 3-1.

FIG. 4 is a block/circuit diagram depicting an exemplary portion of the IL-PLL of FIG. 3.

FIG. 5-1 is a block diagram depicting an exemplary injection-controlled-locked-PLL ("ICL-PLL").

FIG. 5-2 is a block/circuit diagram depicting an exemplary small-signal model of the ICL-PLL of FIG. 5-1.

DETAILED DESCRIPTION

Figure 1:
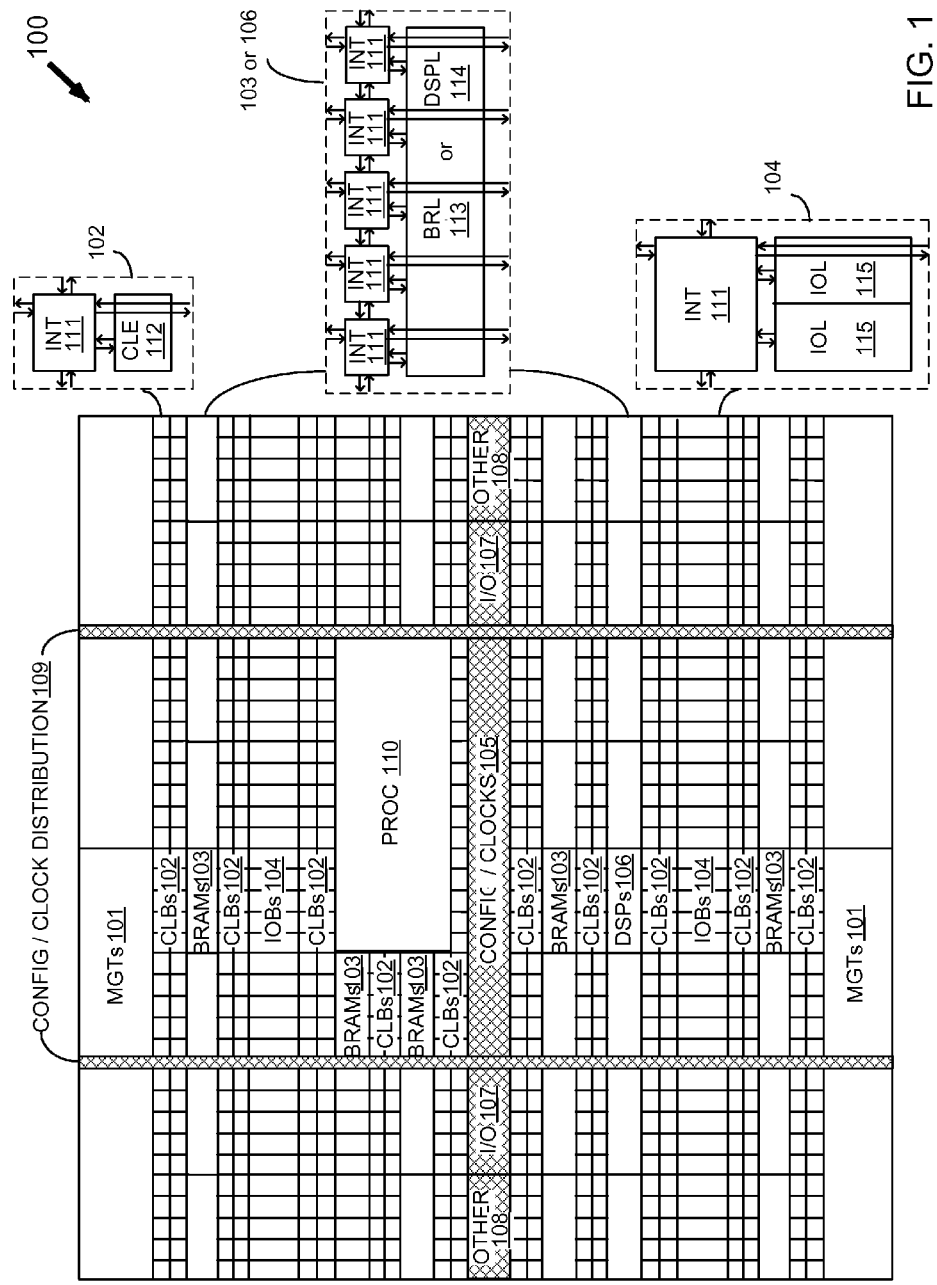
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Before describing the examples illustratively depicted in the several figures, a general introduction is provided to further understanding.

Figures 1, 2:
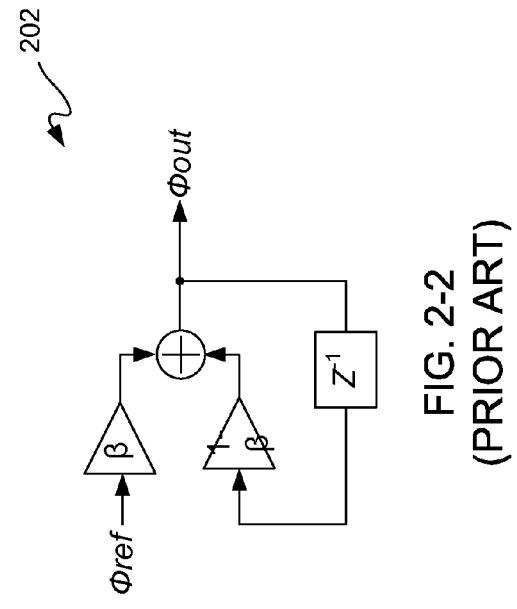
Figure 2:
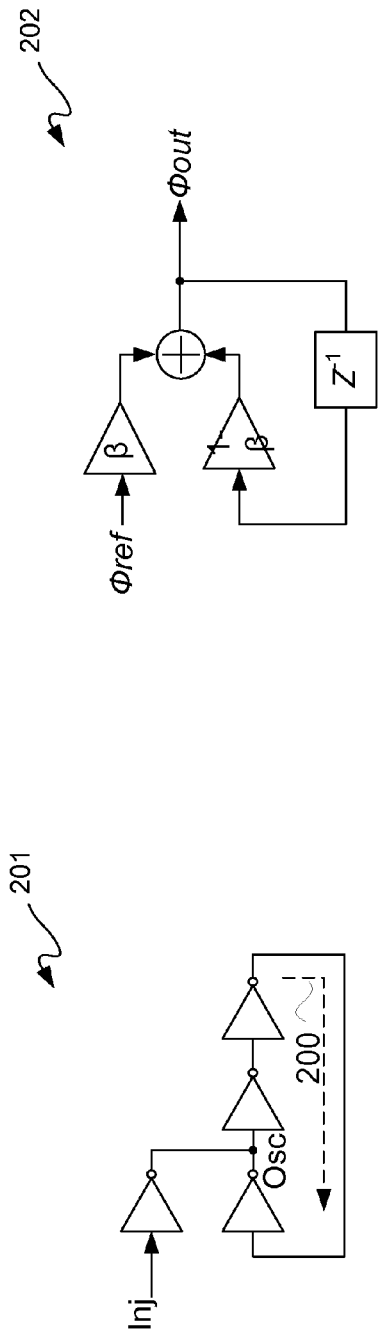

FIGS. 2-1 through 2-4 are generally directed at injection locked oscillation. FIG. 2-1 is a circuit diagram depicting an exemplary conventional injection-locked oscillator 201. Injection-locked oscillator 201 may be a voltage controlled version thereof. A ring or loop 200 of injection-locked oscillator 201 is generally indicated with a dashed line. Even though a three-stage a ring oscillator is illustratively depicted, in other configurations more or fewer than three stages may be used to provide an injection-locked ring oscillator.

FIG. 2-2 is a block/circuit diagram depicting a small-signal discrete-time model 202 of injection-locked oscillator 201 of FIG. 2-1. A unit delay may be of an oscillation period, and parameter β may indicate an injection strength or coupling factor. Along those lines, the larger β is, the stronger the injection strength.

Figures 2, 3:
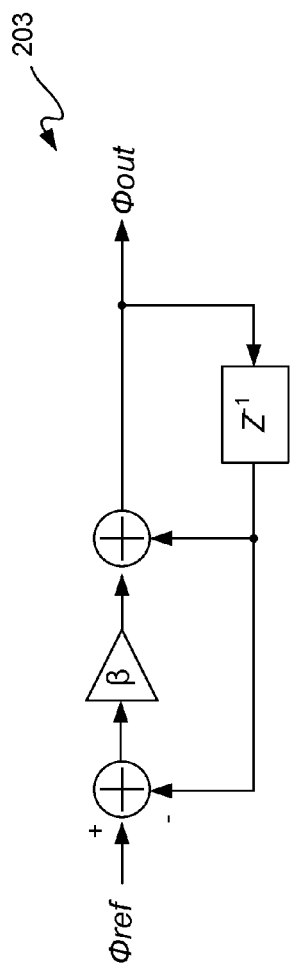

FIG. 2-3 is a block/circuit diagram depicting a reconstruction 203 of small-signal discrete-time model 202 of FIG. 2-2. Along those lines, injection-locked oscillator 201 may be thought of as a first-order phase-locked-loop, where a feedback is more clearly depicted in FIG. 2-3 than in FIG. 2-2.

Generally, operation of an injection-locked oscillator may be described as comparing a previous output phase against a current reference phase. Any phase error is then passed through a gain block that indicates the amount of phase to be corrected. The current output phase is the sum of the previous output phase and the correction phase. As β equals unity, perfect injection may occur and no more interpolation occurs. Thus, a noisy oscillator clock edge input may be replaced with a clean reference edge.

Figures 2, 3, 4:
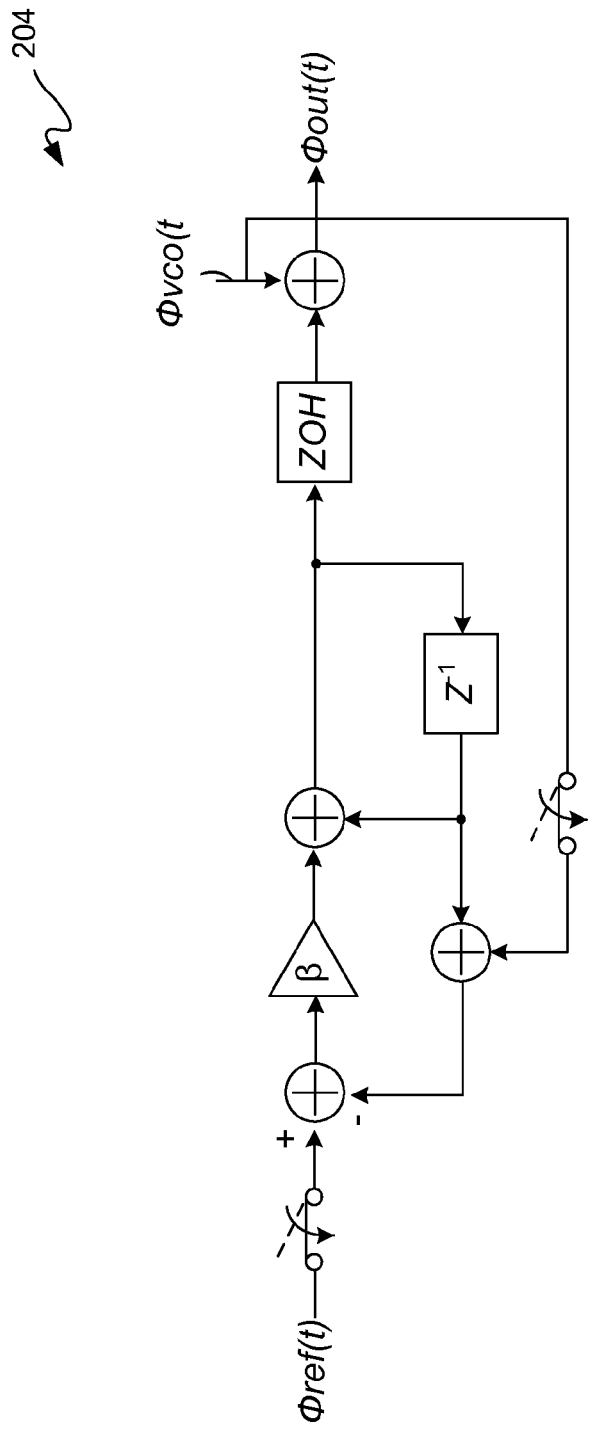
Figures 1, 3:
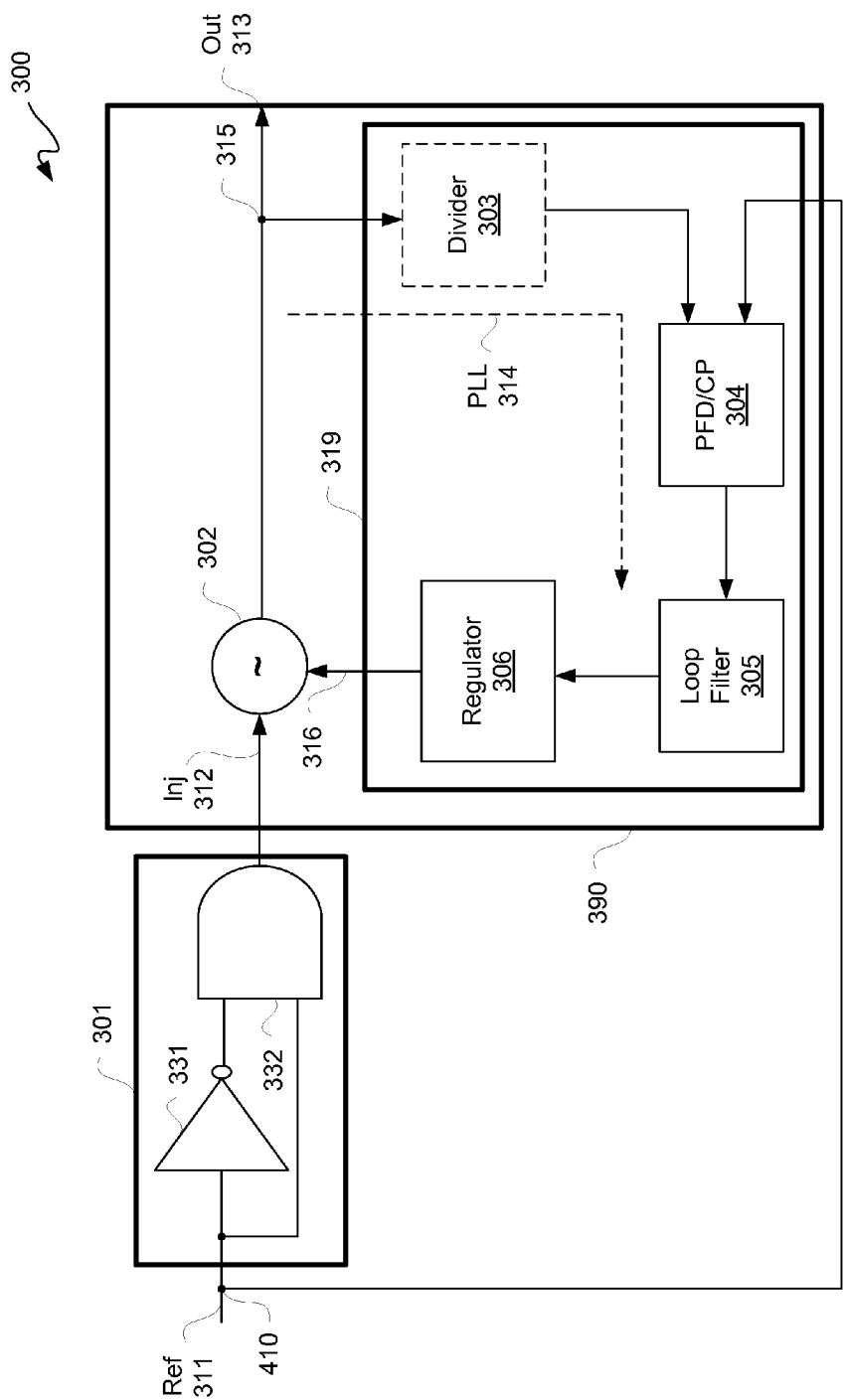
Figures 2, 3:
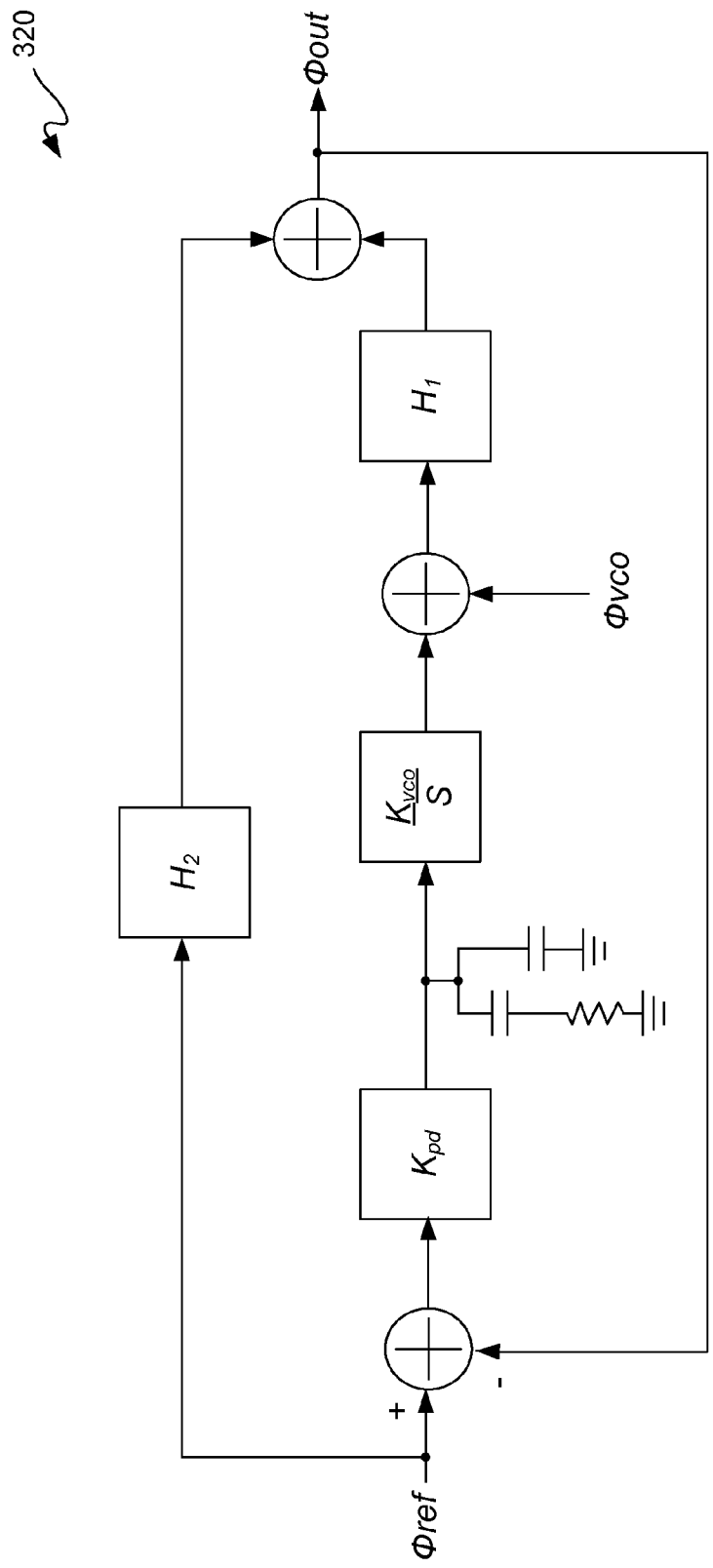
Figure 4:
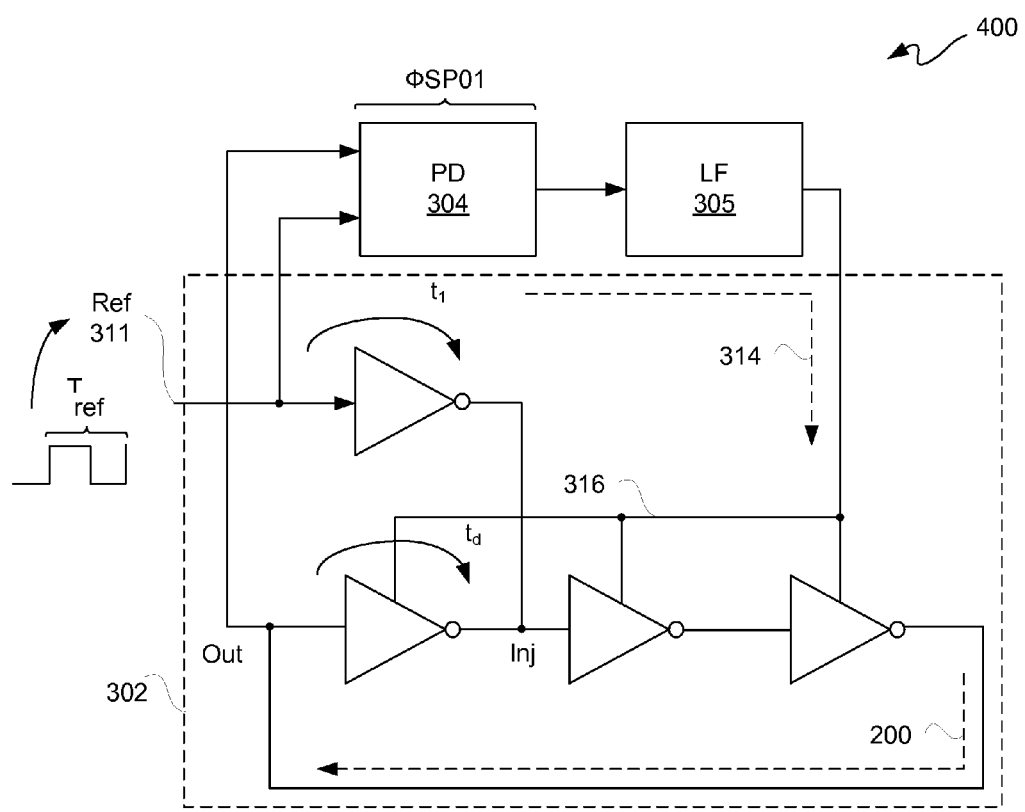

FIG. 2-4 is a block/circuit diagram depicting an exemplary conventional multiplying delay-locked loop ("MDLL") 204. Accordingly, operation of an injection-locked oscillator 201 may be associated with operation of MDLL 204.

Generally, a phase transfer function from a reference input to an output can be derived from FIG. 2-4. Injection-locking may be considered as a discrete-time system, as injection only happens at reference frequency. On the other hand, a phase noise of interest may be a continuous signal, and therefore a sampler may be used at an input. Moreover, a discrete-to-continuous conversion may be used at an output and a zero order-hold ("ZOH") may be inserted.

A phase transfer function from a reference to an output may be where N is a sub-harmonic ratio and is equal to oscillator frequency over reference frequency, or Fosc/Fref. A phase transfer function of noise from an oscillator can be derived from FIG. 2-4. However, instead of including voltage controlled oscillator ("VCO") noise inside a loop as in conventional phase-locked loop ("PLL") model, VCO noise may be sampled and added after a unit delay. In an injection-locked oscillator, a phase comparison and correction may occur simultaneously. This is substantially different from a PLL where phase error is stored in a loop filter and corrected at the next cycle. If VCO noise is added before a unit delay, the current VCO noise is stored which is contradictory to circuit operation. Therefore, VCO noise may be added after ZOH with a sampled version added after a unit delay.

A phase transfer function from VCO noise to an output can be derived. A maximum bandwidth for an injection-locked oscillator may be roughly β*Fref/4, where ½ comes from a discrete nature of a loop and another ½ comes from ZOH.

With the above background on injection-locked oscillation, an injection locked PLL ("IL-PLL") is described below in additional detail.

FIG. 3-1 is a block/circuit diagram depicting an exemplary conventional IL-PLL 300 having a PLL 390. A reference frequency signal 311 is provided at input node 410 as an input to a pulse generator 301 and to a phase-frequency detector and a charge pump block ("PFD/CP") 304. For convenience, PFD/CP 304 is hereinafter referred to as just PFD 304. In this example, pulse generator 301 is formed using an inverter 331 and an AND gate 332; however, any of a variety of pulse generators may be used.

A pulse signal or injection signal 312 is provided as an input to an injection-locked oscillator 302. Injection-locked oscillator 302 may be a voltage controlled oscillator, which is controlled by a voltage control signal 316 provided as an input to injection-locked oscillator 302. An oscillator output 313 from injection-locked oscillator 302, which may be obtained at output node 315, may be a cleaned up version of reference frequency signal 311, where reference frequency signal 311 has a clock pattern.

PLL components 319 of PLL 390 of IL-PLL 300 may include an optional divider 303, PFD 304, loop filter 305, and regulator 306. Oscillator output 313 may be provided as a feedback signal input to PLL components 319 to provide voltage control signal 316 as an output for input to injection-locked oscillator 302. A PLL and/or loop 314 is generally indicated with a dashed line. Additionally, PLL 390 includes oscillator 302 and output node 315.

Depending on a sub-harmonic ratio, a locking range can be a lot less than few percent. Due to limited locking range, a free-running frequency of injection-locked oscillator 302 is brought close to the reference frequency of reference frequency signal 311. This can be achieved with a conventional PLL 390, and hence this combination of an injection-locked oscillator 302 and a PLL 390 is named an IL-PLL 300. Along those lines, IL-PLL 300 may be a sub-harmonic IL-PLL.

There may be disadvantages in IL-PLL 300. First, IL-PLL 300 may not provide sufficient noise shaping in a high-speed, low-power ring oscillator where small transistor size is used. Such small devices may result in high in-band phase noise due to large flicker noise. FIG. 3-2 is a block/circuit diagram depicting an exemplary small-signal model 320 for IL-PLL 300 of FIG. 3-1. Small-signal model 320 may be used to model such high in-band phase noise of IL-PLL 300.

Another drawback of IL-PLL 300 may be due to a mismatch in a static-phase offset ("SPO") between such loops thereof, namely a PLL 314 and a ring or loop 200 of injection-locked oscillator 302, as previously described for example with reference to FIG. 2-1.

FIG. 4 is a block/circuit diagram depicting an exemplary portion 400 of IL-PLL 300. Injection-locked oscillator 302 is illustratively depicted as injection-locked oscillator 201 for purposes of clarity by way of example and not limitation. Loop 200 has associated therewith with a time interval of $t_d$. In contrast, a PLL 314 has a time interval of $t_1$. Furthermore, reference frequency signal 311 has a time interval of $T_{ref}$.

SPO from injection-locking can be described as:

$$\Phi SP02 = \frac{t_1 - t_d}{T_{ref}} 2\pi.$$

In the above equation, time interval $t_d$ is controlled by VCO control voltage signal 316 and is frequency-dependent; contrastingly, time interval $t_1$ is sensitive to PVT variation. SPO from PLL 314 is denoted as $\phi SP01$. In steady-state, a mismatch between $\phi SP01$ and $\phi SP02$ may result in output phase jumping between these two mismatched references and may lead to significant deterministic jitter ("DJ"). In other words, generally, there may be an SPO due to a difference between a natural frequency of injection-locked oscillator 302 and the frequency of reference frequency signal 311. Heretofore, such DJ problem was remedied by calibrating injection timing using a digitally-controlled delay line with complicated control logic at low speed. However, this approach, in addition to adding significant circuitry overhead, was sensitive to PVT variation. This sensitivity meant that calibration was often limited to substantially stable PVT conditions, and such conventional IL-PLL may not have been suitable to conditions with significant variation in one or more of PVT.

With the above general understanding borne in mind, various examples of an IL-PLL with controlled pulse injection are generally described below. Such an IL-PLL is self-adjusting, as well as self-calibrating, so as to be more robust with respect to PVT variation. Furthermore, such an IL-PLL uses substantially less circuitry overhead than such complicated control logic of a conventional IL-PLL.

Figures 1, 5:
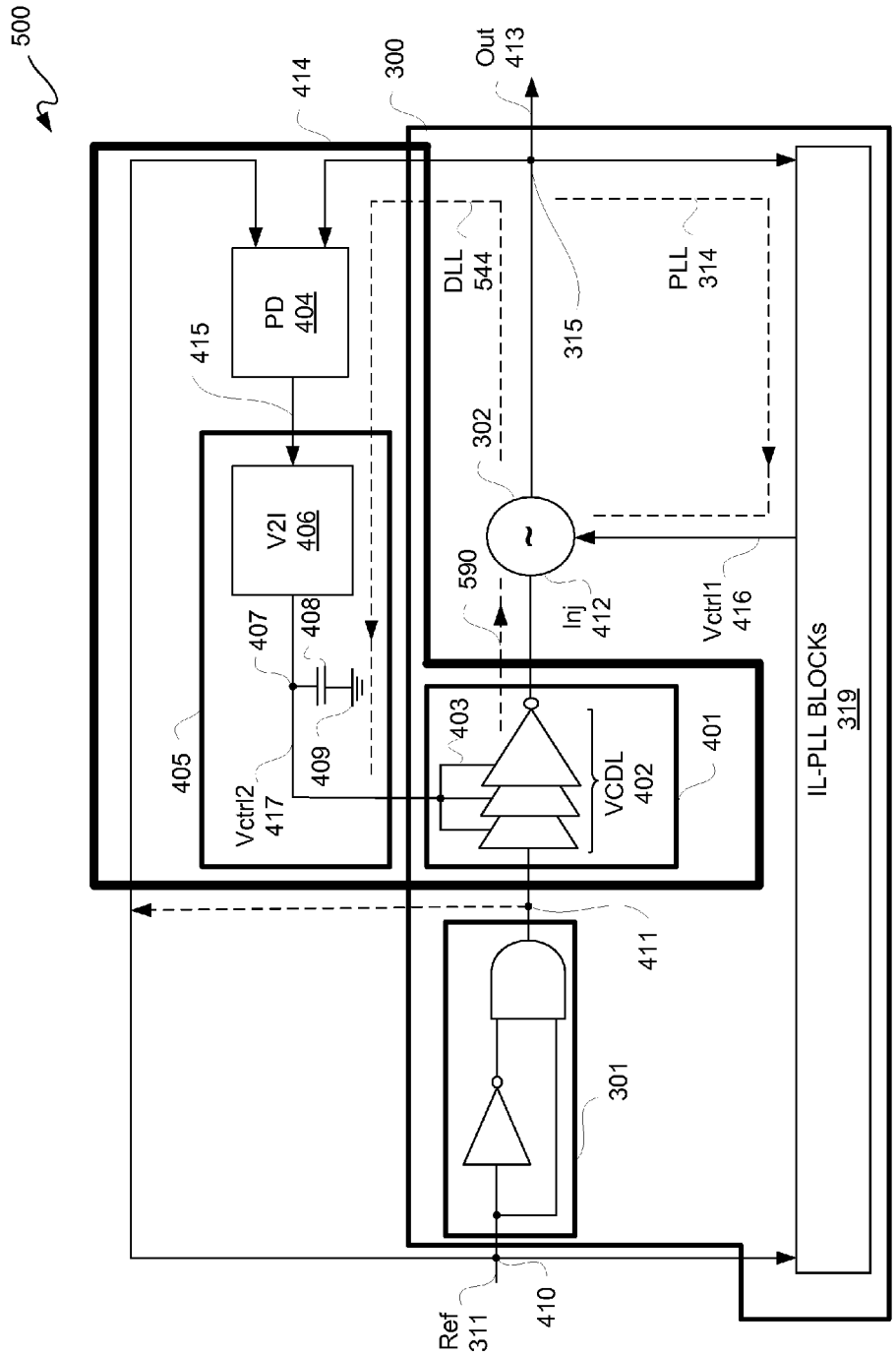
Figures 2, 5:
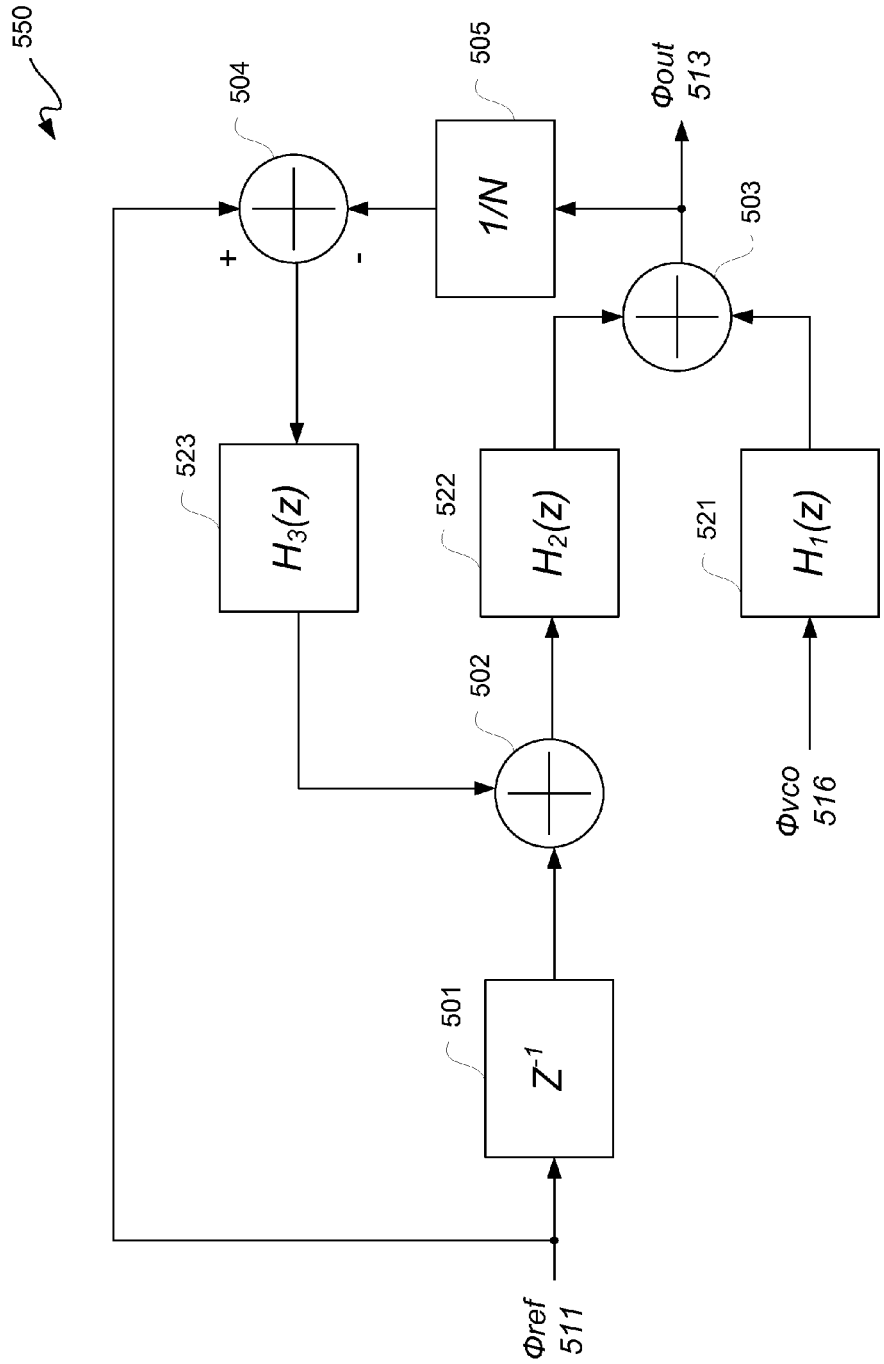

FIG. 5-1 is a block diagram depicting an exemplary injection-controlled-locked-PLL ("ICL-PLL") 500. ICL-PLL 500 includes an IL-PLL, such as IL-PLL 300 for purposes of clarity by way of example not limitation, and a delay-locked loop ("DLL") 414 coupled integrally thereto. More particularly, an injection-locked oscillator 302 of IL-PLL 300 is in a feedback loop path 544 of DLL 414. Additionally, an adjustable delay 401 of DLL 414 is in a common feed forward path 590 of IL-PLL 300 and DLL 414.

DLL 414 may include a phase detector ("PD") 404, converter circuitry 405, and an adjustable delay 401. IL-PLL 300 may be an injection-locked ring PLL, namely injection-locked oscillator 302 may have a ring, such as ring 200 as previously described for example. Furthermore, IL-PLL 300 may be a sub-harmonic IL-PLL. DLL 414 is coupled to self-calibrate pulse position of an injection pulse input 412 of injection-locked oscillator 302, as described below in additional detail. DLL 414 is coupled to shape oscillator noise of injection-locked oscillator 302, as described below in additional detail. Moreover, as described below in additional detail, DLL 414 is coupled to simultaneously shape oscillator noise of injection-locked oscillator 302 and control pulse position of an injection pulse input 412 of injection-locked oscillator 302. DLL 414 may be coupled to shape oscillator noise of injection-locked oscillator 302 with wideband second-order high-pass filtering responsive to position modulation of injection pulse input of injection-locked oscillator 302. DLL 414 may be coupled to self-calibrate pulse position of injection pulse input 412 of injection-locked oscillator 302.

A pulse generator 301 is coupled at input node 410 to receive a reference frequency signal 311, which signal may have a clock pattern, to generate a pulse signal 411. Optionally, ICL-PLL 500 may be used in a data recovery system, such as a clock data recovery ("CDR") system for example. Along those lines, reference frequency signal 311 may have a data pattern, including without limitation a random data pattern.

An adjustable delay 401 of DLL 414 may be coupled to receive pulse signal 411 to provide a delayed pulse signal or injection pulse input 412. Adjustable delay 401 may be a voltage controlled delay line ("VCDL") 402. However, in other configurations, a current controlled delay line may be used. Additionally, rather than an analog controlled adjustable delay line 401 as illustratively depicted, a digitally controlled adjustable delay line may be used. VCDL 402 may include an input bias node 403 to receive a control signal, such as a control voltage signal 417 for example.

An injection-locked oscillator 302 may be coupled to receive delayed pulse signal 412 and to receive a control signal, such as a control voltage signal 416 for example, to provide an oscillator output signal 413 responsive thereto. Such control signal, for example control voltage signal 416, may be provided as part of a locked loop, such as IL-PLL 300, where IL-PLL 300 includes injection-locked oscillator 302.

A locked loop, such as DLL 414, may be coupled to receive a reference signal and oscillator output signal 413 to provide a control signal, such as control voltage signal 416 for example. Such reference signal may be either reference frequency signal 311 or optionally pulse signal 411. Furthermore, either reference signal may be delayed prior to input to PD 404, as described below in additional detail. For purposes of clarity by way of example not limitation, it shall be assumed that reference frequency signal 311 is provided as an input to PD 404; however, in other configurations pulse signal 411 may be provided as an input to PD 404.

Injection-locked oscillator 302 may be in a feedback or loop path of DLL 414. A control signal, such as control voltage signal 417 for example, may be coupled to control delay of adjustable delay 401, such as VCDL 402 for example, to control position of a pulse of delayed pulse signal 412 for injection into injection-locked oscillator 302. Injection-locked oscillator 302 may be a ring injection-locked voltage controlled oscillator, as previously described. A control signal, such as control voltage signal 416 for example, may be used to control injection-locked voltage controlled oscillator 302.

Reference frequency signal 311 and an inherent frequency of injection-locked voltage controlled oscillator 302 may have an SPO. To overcome or mitigate such SPO, oscillator output signal 413 is fed back along with reference frequency signal 311 as respected inputs to PD 404. In this example, PD 404 is configured for sub-sampling, namely a sub-sampling PD ("SSPD") 404. However, in other configurations, PD 404 may be configured for either oversampling or sampling at the same frequency as a reference frequency. For purposes of clarity by way of example and not limitation, it shall be assumed that PD 404 is an SSPD. PD 404 may be configured to provide a difference signal, such as an output voltage signal 415, responsive to a detected phase difference between oscillator output signal 413 and reference frequency signal 311. Again, optionally, pulse signal 411, where delayed version thereof as described below in additional detail, may be fed back to PD 404 along with oscillator output signal 413 to provide output voltage signal 415.

Converter circuitry 405 of DLL 414 may be coupled to receive output voltage signal 415 to provide control voltage signal 417. In this example, converter circuitry 405 includes a voltage-to-current converter ("V2I") 406 and a capacitor 408. However, in other configurations, other circuitry may be used for converting a difference signal provided from a phase detector to a control signal for controlling delay responsive thereto. V2I 406 may be coupled to receive output voltage signal 415 to provide a current output signal coupled at interim node 407. A capacitor 408 may be coupled at interim node 407 to receive such current output signal from V2I 406, and capacitor 408 may be coupled between internode 407 and a ground 409. Along those lines, capacitor 408 may be coupled to charge or discharge responsive to a current output signal from V2I 406 to provide voltage control signal 417 to bias node 403. VCDL 402 may be coupled to receive voltage control signal 417 to control delay of pulse signal 411 for controllably providing delayed pulse signal 412. As IL-PLL blocks 319 were previously described, description of such blocks is not repeated for purposes of clarity.

To overcome one or more limitations of a conventional IL-PLL, an injection-locked oscillator 302 with pulse-position modulation as in ICL-PLL 500 may be used. Along those lines, VCDL 402 may be included along injection path of an IL-PLL 300, and delay of such VCDL 402 may be controlled by negative feedback as provided by oscillator output signal 413 and a reference signal, such as a reference frequency signal 311 or pulse signal 411, as input to PD 404. Along those lines, output phase of injection-locked oscillator 302 may be fed into PD 404 and essentially a DLL 414 may be formed.

FIG. 5-2 is a block/circuit diagram depicting an exemplary small-signal model 550 of ICL-PLL 500 of FIG. 5-1. With simultaneous reference to FIGS. 5-1 and 5-2, small-signal model 550 is further described.

A phase reference 511 is provided as an input to a unit delay 501 and a plus port of an adder/subtractor 504. Output of unit delay 501 is provided to adder 502, and output of adder/subtractor 504 is provided as an input to a transfer function 523, namely $H_3(z)$ or $H_3$. Output of transfer function 523 is provided as another input to adder 502.

Output of adder 502 is provided as an input to a transfer function 522, namely $H_2(z)$ or $H_2$. Output of transfer function 522 is provided as an input to adder 503.

A VCO phase 516 is provided as an input to transfer function 521, namely $H_1(z)$ or $H_1$. Output of transfer function 521 is provided as another input to adder 503.

Output of adder 503 is provided as phase output 513, as well as being provided as an input to a 1/N divider 505, for N a positive integer. Output of divider 505 is provided as an input to a minus port of adder/subtractor 504.

A phase transfer function from a phase reference 511 to phase output 513 may be the same as a conventional DLL with additional low-pass filtering provided by $H_2$ along a forward path. On other hand, a phase transfer function from VCO phase 516 to phase output 513 can be considered as cascading of two transfer functions, namely $H_1$ and a second transfer function with a forward gain of unity and feedback gain that equals a cascading of $H_2$ and $H_3$. Because $H_2$ may be low-passed and $H_3$ may be an integrator, an overall VCO phase transfer function exhibits two zeros at DC. Such characteristic may be beneficial since it allows VCO in-band phase noise to be shaped, for example with 40 dB/decade of slope. Bandwidth of DLL 414 can be designed to be larger than bandwidth of IL PLL 300 due to a first-order nature of IL PLL 300. Therefore, ICL-PLL 500 may be effective in shaping VCO in-band noise. Sufficient margin can be easily achieved without compromising noise performance to address a stability consideration for inclusion of $H_2$ in a loop of DLL 414. Additionally, an SPO mismatch problem in a conventional IL-PLL may be completely eliminated in an ICL-PLL 500, because any mismatch may be absorbed automatically, such as for example by VCDL 402 within a feedback loop of IL-PLL 300. Furthermore, ICL-PLL 500 has a much simpler architecture than a conventional sub-harmonically IL-PLL configured with self-calibrated injection timing.

Figure 6:
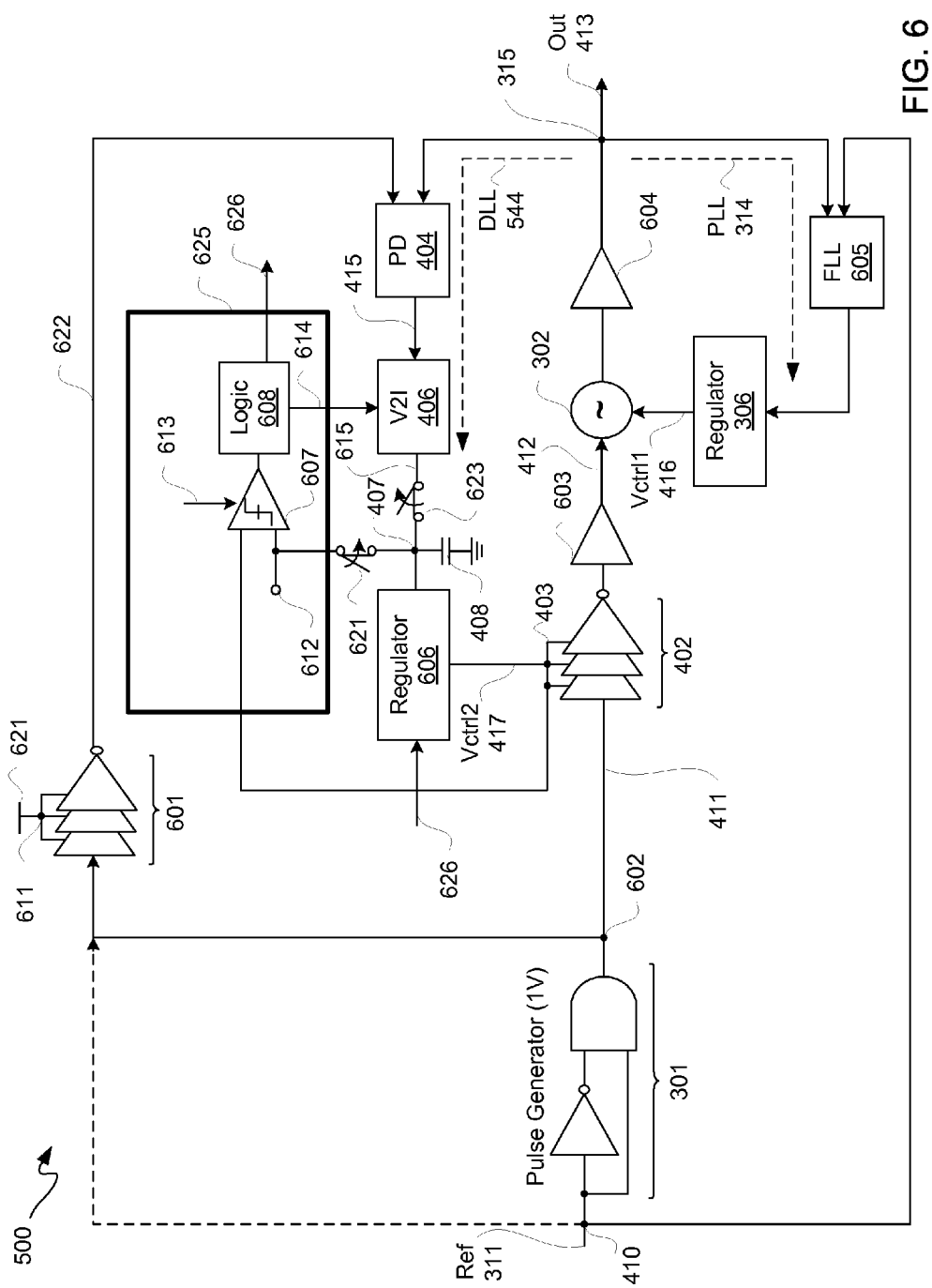
FIG. 6 is a block/circuit diagram depicting another exemplary IC-PLL.

FIG. 6 is a block/circuit diagram depicting another exemplary IC-PLL 500. As much of IC-PLL 500 in FIG. 6 is the same as that in FIG. 5, generally only the differences are described below for purposes of clarity.

Output of pulse generator 301, namely pulse signal 411 may be provided to an interim node 602. Interim node 602 may be coupled to an input of another adjustable delay or fixed delay 601. For purposes of clarity by way of example and not limitation, it shall be assumed that pulse generator 301 is a 1 volt ("V") logic high level pulse generator and that delay 601 is an adjustable delay. Along those lines, it shall be assumed for purposes of clarity by way of example and not limitation that VCDL 402 is eight stages. Furthermore, it shall be assumed that adjustable delay 601 is a VCDL 601 which is 16 stages. However, it should be appreciated that other numbers of stages and/or other voltage levels may be used in other configurations.

Optionally, reference frequency signal 311 may be provided as input to VCDL 601 instead of pulse signal 411. Even though either of these reference signals may be used for input to VCDL 601, for purposes of clarity by way of example not limitation, it shall be assumed that pulse signal 411 is provided as an input to VCDL 601. VCDL 601 has a bias node 611 which may be coupled to a supply voltage 621. For this example, supply voltage 621 may be a 1 V supply; however, again, other supply voltage levels may be used in other configurations. Output of VCDL 601 may be a delayed version of pulse signal 411, namely delay pulse signal 622.

Delay pulse signal 412 output from VCDL 402 may optionally be provided to a buffer 603 for buffering prior to input to injection-locked oscillator 302. Oscillator output signal 413 may be optionally provided to a buffer 604 for buffering prior to being provided to output node 315. Again, oscillator output signal 413 may be provided as an input to PD 404, along with delay pulse signal 622, for feedback. PD 404 may be configured to provide an output voltage signal 415 responsive to a detected phase difference between oscillator output signal 413 and delayed pulse signal 622.

A calibration circuit 625 may be included with converter circuitry. Additionally, optionally, a regulator 606 may be coupled to receive current signal 615 from V2I 406 after conversion to a voltage responsive to charging and discharging of capacitor 408. Regulator 606 may be used to clean up control voltage signal 417 prior to providing to VCDL 402.

Switches 621 and 623, which may be implemented using transistors, operate mutually exclusive to one another. Thus, if switch 623 is open, then switch 621 is closed, and vice versa. Switch 623 is closed for an operational mode, and switch 621 is closed for a calibration mode.

For a calibration mode, control voltage 417 is tapped at bias node 403 for providing as an input to comparator 607 of calibration circuit 625. Another input to comparator 607 may be a threshold voltage level or a threshold voltage level coupled at a voltage supply node 612. For purposes of clarity by way of example and not limitation, it shall be assumed that such a threshold voltage level is 0.8 V; however, in other configurations other threshold voltage levels may be used. Switch 621 is coupled between voltage supply node 612 and internode 407 to provide such a voltage to such node for regulator 606 and capacitor 408. A strobe signal 613 may be provided as a control input to comparator 607.

Output of comparator 607 may be provided to logic 608 of calibration circuit 625. Strobed operation of comparator 607 may provide a compared output indicating whether control voltage signal 417 is above or below a threshold voltage level 612. Such compared output may be provided to logic 608 for producing a sign signal 614. When sign signal 614 indicates that control voltage signal 417 has a voltage level above threshold voltage level 612, such as indicating a positive sign, switch 621 may be opened and switch 623 may be closed under control of logic 608, though not shown for purposes of clarity and not limitation. When sign signal 614 indicates that control voltage signal 417 has a voltage level below threshold voltage level 612, such as indicating a negative sign, switch 621 may remain closed and switch 623 may remain open under control of logic 608, though not shown for purposes of clarity and not limitation, and a reset signal 626 may be provided from logic 608 to regulator 606 to effectively reset IL-PLL 300.

A frequency-locked loop ("FLL") 605 of IL-PLL 300 may be coupled to receive reference frequency signal 311 and oscillator output signal 413 to provide a voltage output for voltage regulator 306. Regulator 306 of IL-PLL 300 may be coupled to receive such voltage output to provide control voltage signal 416. FLL 605, which may replace PFD 304, may be a conventional FLL or a phase independent FLL, such as described in additional detail in co-pending patent application entitled "EDGE DENSITY DETECTION" by Wayne Fang, concurrently filed and commonly assigned herewith, which is incorporated by reference herein in its entirety for all purposes.

Figure 7:
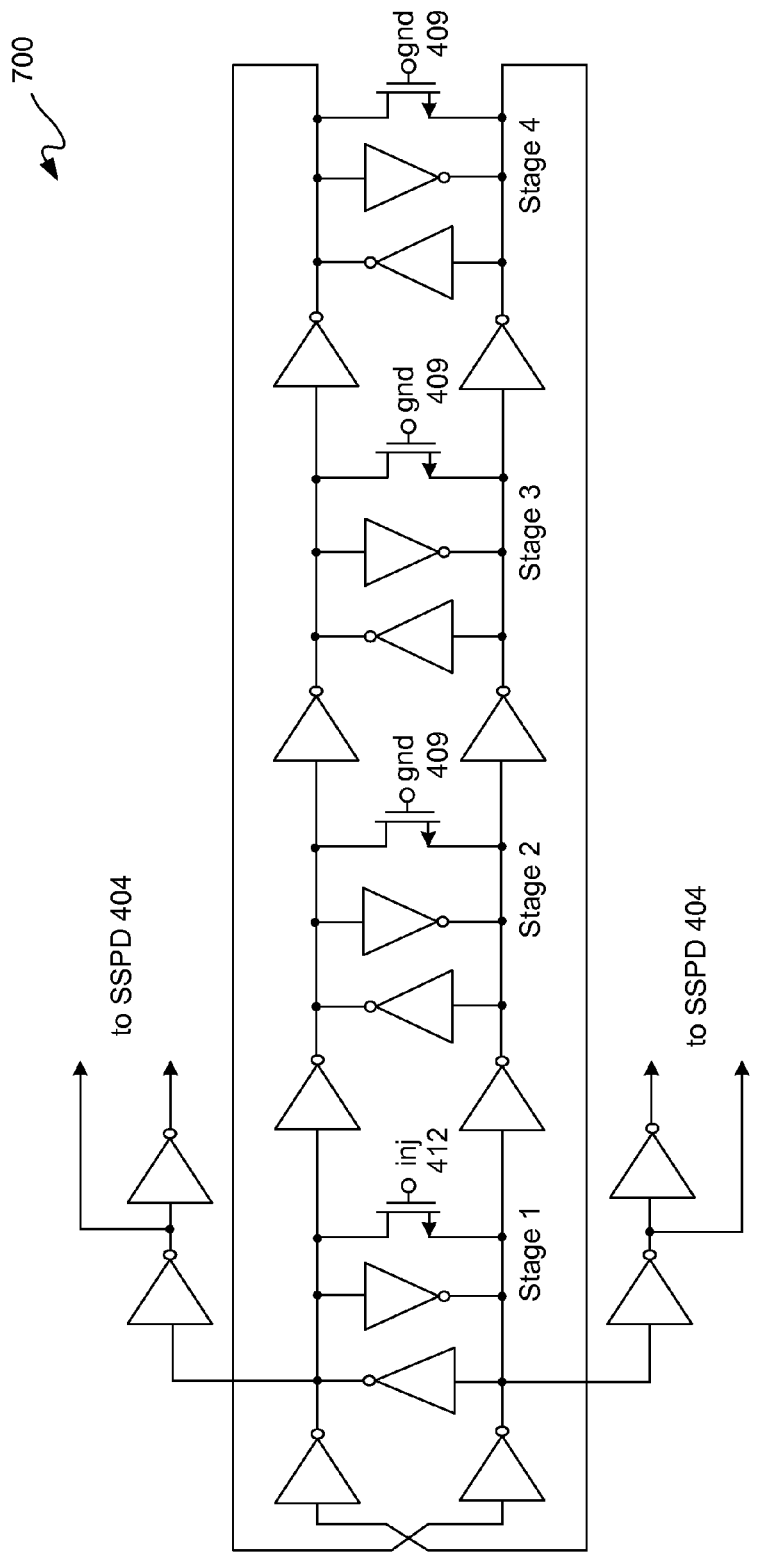
FIG. 7 is a circuit/schematic diagram depicting an exemplary multistage injection-locked oscillator.

FIG. 7 is a circuit/schematic diagram depicting an exemplary multistage injection-locked VCO 700. Multistage injection locked VCO 700 in this example is a four-stage differential injection-locked ring oscillator. However, in other configurations fewer or more than four stages may be used. Injection-locked VCO 700 may be used as injection-locked oscillator 302, as previously described herein. Injection-locked VCO 700 may be coupled to an SSPD 404, as well as other connections as generally indicated. Stage I is an injection stage coupled to receive delay pulse signal 412. Stages 2 through 4 are ground stages coupled to a ground 409. Even though NMOS transistors are illustratively depicted, PMOS transistors may be used. Along those lines, NMOS transistors may be for example coupled to ground 409 for disabled injection stages; however, in a configuration with PMOS transistors instead of NMOS transistors, such PMOS transistors may be coupled to a supply voltage, such as VCC for example, for disabled injection stages.

Figures 8, 9:
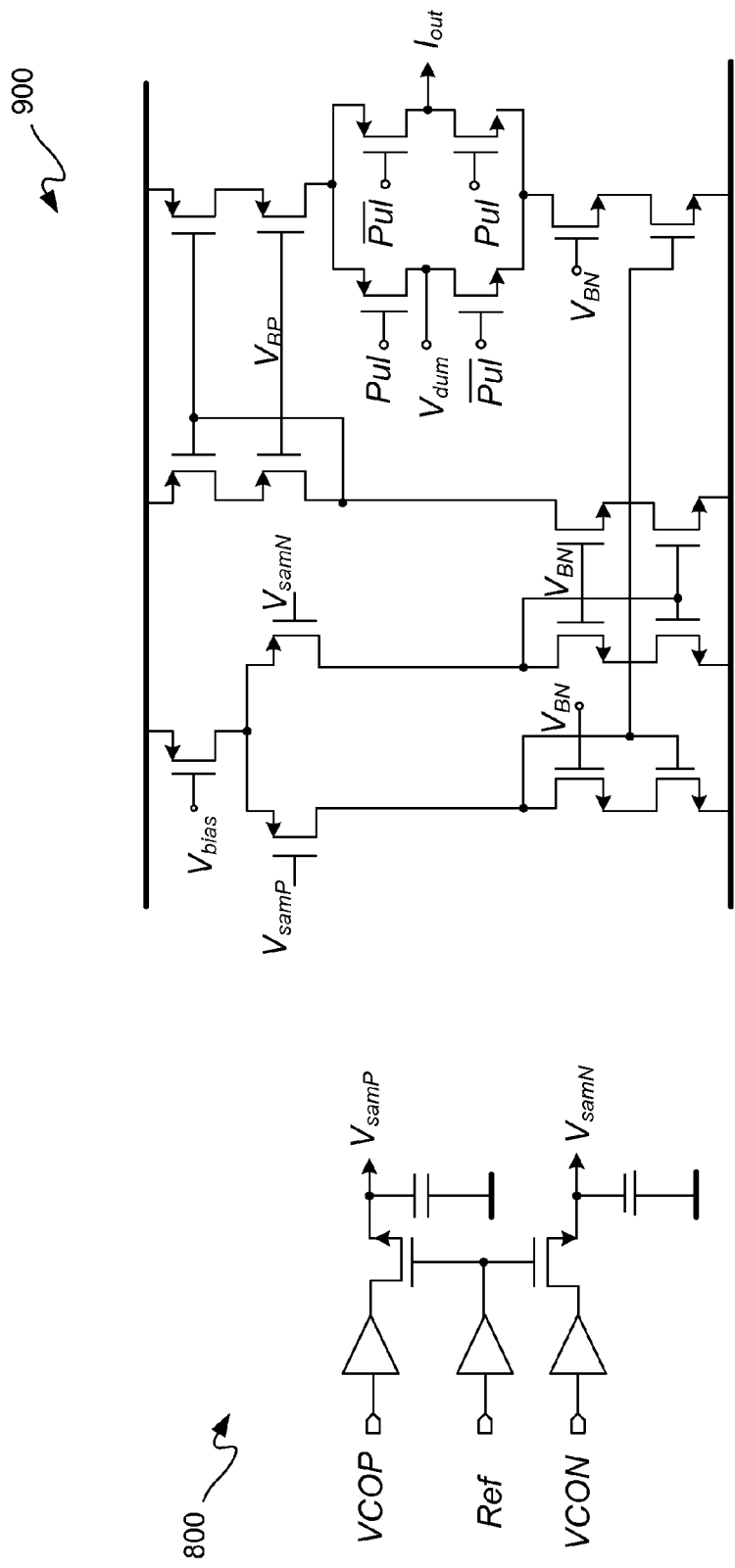
FIG. 8 is a circuit/schematic diagram depicting an exemplary sub-sampling phase detector.
FIG. 9 is a circuit/schematic diagram depicting an exemplary voltage-to-current converter.

FIG. 8 is a circuit/schematic diagram depicting an exemplary SSPD 800, and FIG. 9 is a circuit/schematic diagram depicting an exemplary voltage-to-current converter 900. SSPD 800 may generally be a differential sample-and-hold circuit. SSPD 800 may be used as PD 404, as previously described herein with reference to FIG. 5-1 for example, and voltage-to-current converter 900 may be used as V2I 406, as previously described herein with reference to FIG. 5-1 for example.

Figure 10:
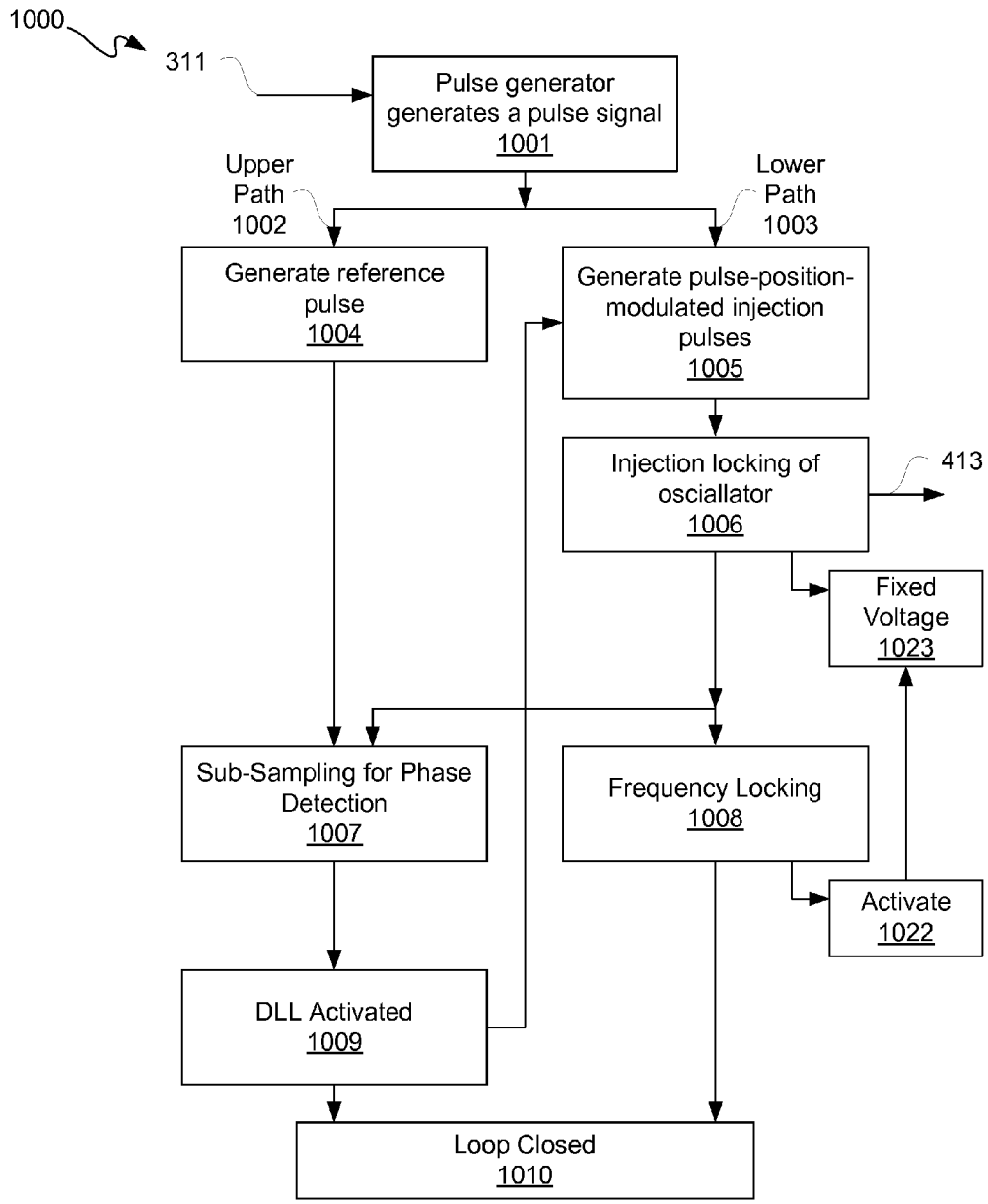
FIG. 10 is a flow diagram depicting an exemplary operational flow for the ICL-PLL of FIG. 5-1.

FIG. 10 is a flow diagram depicting an exemplary operational flow 1000 for ICL-PLL 500 of FIG. 5-1. Operational flow 1000 is further described with simultaneous reference to FIGS. 5-1 and 6 through 10.

Generally, IL-PLL 500 has three loops, namely ring loop 200, DLL 544, and PLL 314. These loops may be activated sequentially. First, an injection-locked oscillator may be started to initiate a ring loop 200; however, this activation may be started as part of initiation of an FLL 605, which in turn activates a PLL 314. After activation of loops 200 and 314, a loop 544 of DLL 414 may be activated. This sequence of activation is described below in additional detail.

At 1001, a pulse generator 301 and generates a pulse signal 411 with a pulse-width controllable within a predefined range at a pulse repetition rate ("PRR") of a received reference frequency signal 311. For purposes of clarity by way of example not limitation, it shall be assumed that such range is from approximately 5 to 40 ps.

Pulse signal 411 may be separated into two paths, namely an upper path 1002 and a lower path 1003. Along upper path 1002, at 1004 a reference pulse may be generated for subsampling phase detector ("SSPD") 404 of DLL 414 after some fixed delay, as previously described herein. As previously described herein, such reference pulse may be provided from reference frequency signal 311 directly or from output of pulse generator 301. For purposes of clarity by way of example not limitation, it shall be assumed that such fixed delay is approximately in a range of 100 to 140 ps. Along those lines, delaying input of such pulse to SSPD 404 to compensate for delays within ICL-PLL 500, allows for a smaller VCDL 402, namely one that covers a narrower timing range than if no delay compensation was used. Along lower path 1003, at 1005 a pulse signal 411 input to VCDL 402 may be used to generate pulse-position-modulated injection pulses of injection pulse signal 412.

From 1005, injection locking of an oscillator may occur at 1006, and such injection-locked oscillator output 413 may be output from 1006. Such injection locking may be used to control phase locking of IL-PLL 300. For purposes of clarity by way of example and not limitation, assuming an injection-locked oscillator 700 is used, namely a 4-stage differential inverter-based ring oscillator with a bridge switch across differential nodes, as shown in FIG. 7, as an injection pulse arrives, a switch is on shorting two differential nodes. Therefore, upon locked state, a falling edge of such an injection pulse may be aligned with zero-crossing points of a differential oscillator waveform. An injection can be locked at a rising or a falling edge of oscillation waveforms depending on initial phase relationship between an injection pulse and a VCO waveform. This may result in bi-modal operation. In other words, bi-modal steady states may exist, which states may be monitored and controlled.

From 1004 and 1006, at 1007 subsampling for phase detection may be performed. Assuming use of SSPD 800, SSPD 800 performs sampling on VCO waveforms as switches thereof may be off. A sampled differential error voltage may be nulled out by action of DLL 414, and therefore upon locked condition, SSPD 800 may likewise lock to a zero-crossing-point of a VCO waveform, or more generally zero-crossing points of VCO waveforms. However, unlike injection-locking, such an SSPD 800-DLL 414 may only lock to either a rising edge or a falling edge of clock signal, because sign in gain of SSPD 800 depends on the slope of a signal to be sampled. Along those lines, DLL 414 may only lock to an edge where negative feedback may be achieved.

From 1006, at 1008, FLL 605 may be used to perform frequency locking. Inverters in both a ring oscillator 700 and VCDL 402 may be supply-regulated. FLL 605 may have a locking range of approximately 5 MHz and a VCO gain constant ("Kvco") of approximately 20 GHz/V. Along those lines, a 12-bit DAC (not shown) of FLL 605 may be used to convert a digitized code word from a frequency detector (not shown) to an analog control voltage. Optionally, a delta-sigma modulator (not shown) may be used to truncate a high-resolution code word into 4 bits in order to employ a smaller DAC. A cascade of two low-pass RC filters (not shown) may be used to filter out a high frequency component at an output of such DAC.

The following proposed sequence may be used for operation. First, FLL 605 may be activated at 1022 to bring a free-running frequency of oscillator 700 close to harmonics of reference frequency signal 311. FLL 605 bandwidth may be chosen for frequency locking which may vary from application-to-application. For purposes of clarity by way of example and not limitation, it shall be assumed that FLL 605 bandwidth is approximately 10 kHz and approximately 500 µs may be needed for frequency locking. However, it should be understood that in other configurations, other bandwidths, as well as other frequency locking times, may be used.

Second, a pulse through VCDL 402 may be allowed to come into oscillator 700, and at 1023 oscillator 700 may perform injection-locking under a fixed VCDL control voltage, such as for example 0.8 V as previously described. Depending on reference frequency and injection strength, such locking time may vary. For this example, it shall be assumed that such locking time may vary between approximately 10 to 100 ns.

After injection-locked, DLL 414 may be activated at 1009 for self-adjustment of delay for generation of pulse-position modulated injection pulses at 1005. Along those lines, there may be a self-adjustment of a delay of DLL 414 to control pulse injection at 1005 in oscillator 700 responsive to a detected phase difference at 1007 between an injection-locked oscillator 700 output at 1006 and a reference signal provided at 1004. However, generally once DLL 414 and IL-PLL 300 of ICL-PLL 500 are both in a lock state, such loops may be closed at 1010.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
an injection-locked phase-locked loop; and
a delay-locked loop coupled to the injection-locked phase-locked loop;
wherein an injection-locked oscillator of the injection-locked phase-locked loop is in a feedback loop path of the delay-locked loop.

2. The apparatus according to claim 1, wherein the injection-locked phase-locked loop comprises an injection-locked ring phase-locked loop.

3. The apparatus according to claim 1, wherein the injection-locked phase-locked loop comprises a sub-harmonic injection-locked phase-locked loop.

4. The apparatus according to claim 1, wherein the delay-locked loop is coupled to self-calibrate pulse position of an injection pulse input of the injection-locked oscillator.

5. The apparatus according to claim 1, wherein the delay-locked loop is coupled to shape oscillator noise of the injection-locked oscillator.

6. The apparatus according to claim 1, wherein the delay-locked loop is coupled to shape oscillator noise of the injection-locked oscillator and to control pulse position of an injection pulse input of the injection-locked oscillator.

7. The apparatus according to claim 6, wherein the delay-locked loop is coupled to shape oscillator noise of the injection-locked oscillator with wideband second-order high-pass filtering responsive to position modulation of the injection pulse input of the injection-locked oscillator.

8. The apparatus according to claim 6, wherein the delay-locked loop is coupled to self-calibrate pulse position of the injection pulse input of the injection-locked oscillator.

9. An apparatus, comprising:
a pulse generator to receive a reference frequency signal to generate a pulse signal;
an adjustable delay to receive the pulse signal to provide a first delayed pulse signal;
an injection-locked oscillator coupled to receive the first delayed pulse signal and to receive a first control signal to provide an oscillator output signal responsive thereto;
wherein the first control signal is of a first locked loop;
wherein the first locked loop includes the injection-locked oscillator;
a second locked loop coupled to receive a reference signal and the oscillator output signal to provide a second control signal;
wherein the reference signal is either the reference frequency signal or a version of the pulse signal;
wherein the second locked loop includes the adjustable delay;
wherein the injection-locked oscillator is in a feedback path of the second locked loop; and
wherein the second control signal is coupled to control delay of the adjustable delay to control position of a pulse of the first delayed pulse signal for injection into the injection-locked oscillator.

10. The apparatus according to claim 9, wherein the second locked loop comprises a delay-locked loop.

11. The apparatus according to claim 10, wherein the first locked loop comprises an injection-locked phase-locked loop.

12. The apparatus according to claim 11, wherein:
the injection-locked oscillator comprises an injection-locked voltage controlled oscillator;
the first control signal is a first control voltage signal used to control the injection-locked voltage controlled oscillator;
the adjustable delay comprises a first voltage controlled delay line; and
the second control signal is a second control voltage signal used to control the injection-locked voltage controlled oscillator.

13. The apparatus according to claim 12, wherein:
the reference frequency signal and an inherent frequency of the injection-locked voltage controlled oscillator have a static phase offset; and
the reference frequency signal has a clock pattern.

14. The apparatus according to claim 12, wherein:
a frequency-locked loop of the injection-locked phase-locked loop is coupled to receive the reference frequency signal and the oscillator output signal to provide a voltage output; and
a voltage regulator of the injection-locked phase-locked loop is coupled to receive the voltage output to provide the first control voltage signal.

15. The apparatus according to claim 12, further comprising:
a second voltage controlled delay line of the delay-locked loop coupled to receive the reference signal to provide a second delayed pulse signal;
a phase detector of the delay-locked loop coupled to receive the oscillator output signal and the second delayed pulse signal for feedback;
wherein the phase detector is configured to provide an output voltage signal responsive to a detected phase difference between the oscillator output signal and the second delayed pulse signal; and
converter circuitry of the delay-locked loop coupled to receive the output voltage signal to provide the second control voltage signal.

16. The apparatus according to claim 15, wherein the phase detector comprises a sub-sampling phase detector.

17. The apparatus according to claim 15, wherein the converter circuitry comprises:
a voltage-to-current converter coupled to receive the output voltage signal to provide a current signal;
a capacitor coupled to receive the current signal and to a ground;
wherein the capacitor is coupled to charge or discharge responsive to the current signal to provide the second voltage control signal; and
wherein the first voltage controlled delay line is coupled to receive the second voltage control signal to control delay of the pulse signal for providing the first delayed pulse signal.

18. The apparatus according to claim 17, wherein:
the converter circuitry includes a calibration circuit;
the calibration circuit is configured to determine whether the second control voltage signal is above a threshold voltage level; and
the calibration circuit is configured to reset the injection-locked phase-locked loop responsive to the second control voltage signal not being above the threshold voltage level.

19. A method, comprising:

obtaining a reference frequency signal by an injection-locked phase-locked loop;

generating a pulse signal with a pulse generator of the injection-locked phase-locked loop coupled to receive the reference frequency signal;

providing a reference signal to a delay-locked loop coupled to the injection-locked phase-locked loop;

wherein the reference signal is either the pulse signal or the reference frequency signal;

self-adjusting a delay of the delay-locked loop to control pulse injection in the injection-locked phase-locked loop responsive to a detected phase difference between an injection-locked oscillator output of the injection-locked phase-locked loop and a version of the reference signal; and outputting the injection-locked oscillator output from the injection-locked phase-locked loop.

20. The method according to claim 19, wherein the self-adjusting of the delay of the delay-locked loop comprises:

generating a first delay and a second delay to respectively provide a first version of the pulse signal and a second version of the pulse signal;

wherein the first version of the pulse signal is the version of the reference signal;

inputting the first version of the pulse signal and the injection-locked oscillator output to a phase detector of the delay-locked loop;

converting a detected phase difference between the first version of the pulse signal and the injection-locked oscillator output to a control signal;

adjusting the second delay responsive to the control signal;

wherein the second delay of the second version of the pulse signal is controlled to control the pulse injection responsive to the control signal; and inputting the second version of the pulse signal to an injection-locked oscillator of the injection-locked phase-locked loop for the pulse injection to control phase locking of the injection-locked phase-locked loop.

* * * * *